United States Patent [19]
Laporte

[11] Patent Number: 6,077,383
[45] Date of Patent: Jun. 20, 2000

[54] DEVICE FOR SEPARATING WAFERS AND PROCESS FOR USING SAID DEVICE

[75] Inventor: Philippe Laporte, Sassenage, France

[73] Assignee: Commissariat a l'Energie, France

[21] Appl. No.: 08/898,839

[22] Filed: Jul. 23, 1997

[30] Foreign Application Priority Data

Aug. 12, 1996 [FR] France .................................. 96 10111

[51] Int. Cl.⁷ .................................................. B32B 35/00
[52] U.S. Cl. .......................... 156/344; 156/584; 29/239; 29/426.5
[58] Field of Search ................................... 29/239, 426.5, 29/426.3; 156/344, 584; 81/3.47, 3.48, 3.55, 3.7; 132/142, 159, 901

[56] References Cited

U.S. PATENT DOCUMENTS

| | | | |
|---|---|---|---|
| D. 353,915 | 12/1994 | Lanne ...................................... D30/159 |
| 1,531,289 | 3/1925 | Klingbeil .................................... 81/3.7 |
| 2,482,928 | 9/1949 | Neff et al. ............................. 132/901 X |
| 2,607,064 | 8/1952 | Sullivan et al. ....................... 132/901 X |
| 2,761,460 | 9/1956 | Egan, Jr. .................................. 132/142 |
| 4,807,652 | 2/1989 | Bachrach ................................. 132/137 |
| 4,819,670 | 4/1989 | Saferstein et al. ....................... 132/156 |
| 5,240,546 | 8/1993 | Shiga .................................. 156/584 X |
| 5,514,235 | 5/1996 | Mitani et al. ........................ 156/281 X |
| 5,783,022 | 7/1998 | Cha et al. ................................ 156/344 |
| 5,873,374 | 2/1999 | Sanz ....................................... 132/125 |
| 5,897,743 | 4/1999 | Fujimoto et al. .................... 156/344 X |

OTHER PUBLICATIONS

Patent Abstracts of Japan —vol. 16, No. 158 (E–1191), Apr. 17, 1992 & JP 04 010454 A (Sanyo) * abrege. *
Patent Abstracts of Japan —vol. 13, No. 33 (M–789), Jan. 25, 1989 & JP 63 242842 A (Mitsubishi) * abrege. *

*Primary Examiner*—Mark A. Osele
*Attorney, Agent, or Firm*—Burns, Doane, Swecker & Mathis LLP

[57] ABSTRACT

A device for the separation of wafers bonded by forces of attraction. The device includes at least one assembly of at least two flexible elements whose width in a direction perpendicular to the planes of the wafers is less than the largest gap between the ends of the wafers.

41 Claims, 2 Drawing Sheets

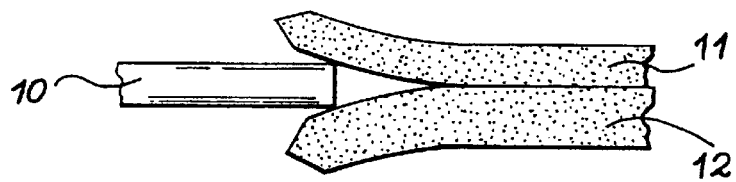
FIG._1
(PRIOR ART)
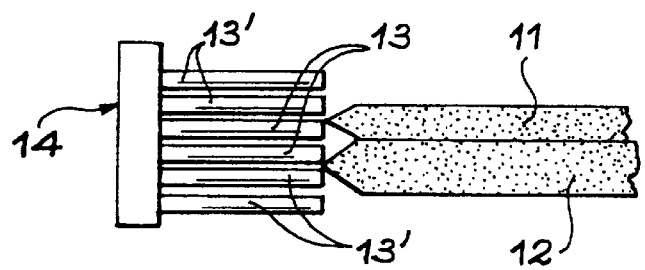
FIG._2
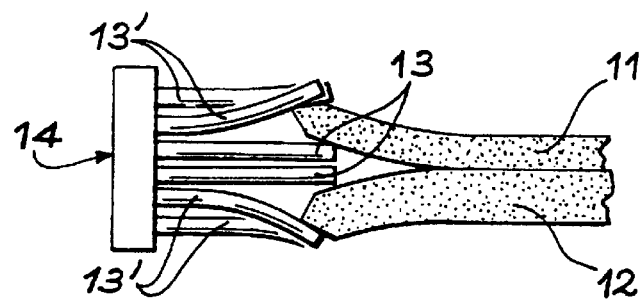
FIG._3
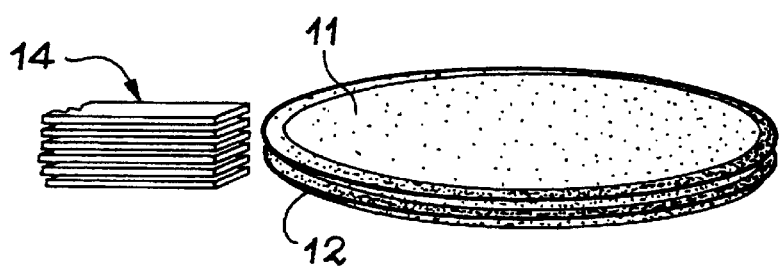
FIG._4A
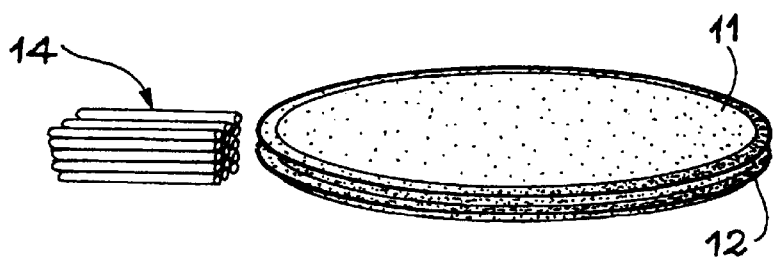
FIG._4B

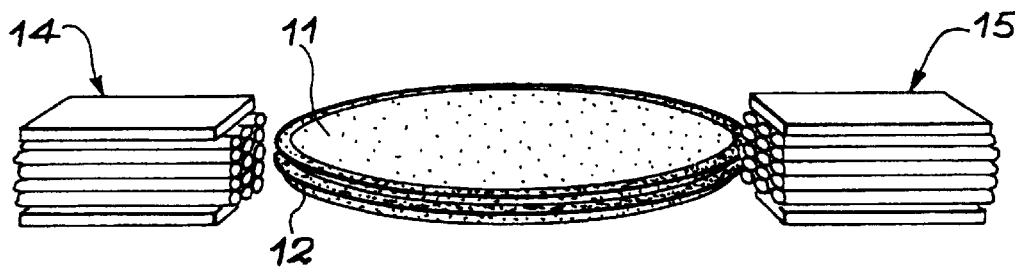
FIG._5A
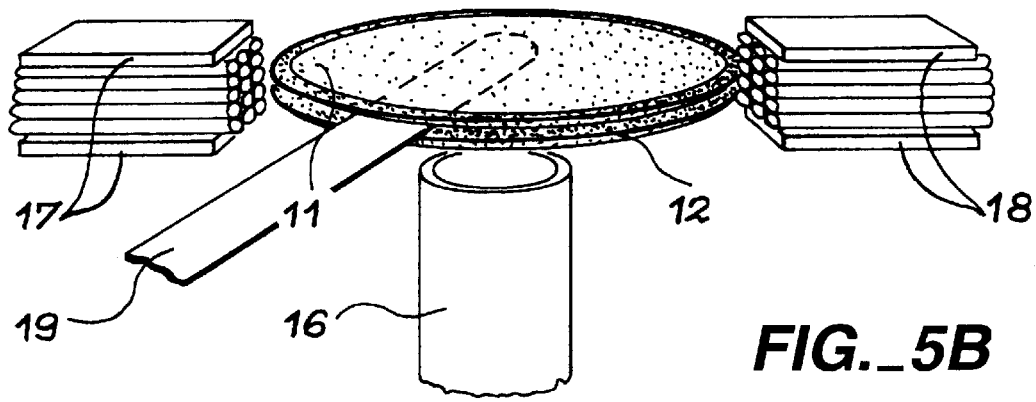
FIG._5B
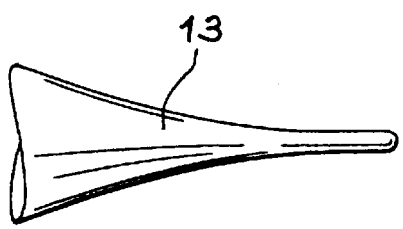
FIG._6
FIG._7A
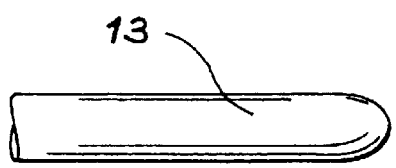
FIG._7B
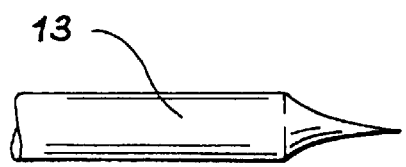
FIG._7C

DEVICE FOR SEPARATING WAFERS AND PROCESS FOR USING SAID DEVICE

DESCRIPTION

1. Technical Field

The present invention relates to a device for separating wafers and to its use process.

2. Prior Art

The field of the invention is electronics and component production technology.

In an article entitled "Bonding of silicon wafers for silicon-on-insulator" by W. P. Maszara, G. Goetz, A. Caviglia and J. B. McKitterick (Applied Physics, 64 (10), Nov. 15, 1988, p 4943), information is provided on measuring the joining or adhesive force between two "bonded" wafers. For this purpose a thin plate or foil 10 is inserted between the two wafers 11 and 12, as illustrated in FIG. 1. The adhesion force is measured by the length over which the separation extends. This article reveals that it is possible to separate two wafers using such a procedure.

However, the separation by a plate according to this article is not used for the separation of the wafers as an end in itself, but in order to evaluate their force of attraction. Such a solution requires a very precise manipulation (observation and guidance) of the plate in order to insert it in the joint between the two wafers. Such precision is incompatible with rapid and inexpensive automation of the separation operation.

In the field of power electronics, ever thinner silicon wafers are used (compared with the microelectronic standard). This evolution gives rise to two main problems, the first being the handling of substrates, which are increasingly fragile with respect to shocks and which become flexible, and the second is the non-operation with thin wafers of numerous equipments set or designed for handling thicker wafers.

This problem can become that of conventional microelectronics, where there is an increase in the diameter of the wafers. This diameter increase is accompanied by a substrate thickness increase for mechanical reasons, whereas the electronic devices are only designed in an ever thinner surface layer. One solution then consists of designing the device in a bonded silicon film on a basic substrate.

This solution developed for designing devices on thin wafers then uses a provisional "bonding" of the wafer on a support adapted as regards thickness to the treatment to be carried out, but of the same diameter. Bonding does not use the adhesive layer, but simply the forces of attraction of surfaces, such as Van der Waals forces, electrostatic forces or the hydrophilic characteristics of the surfaces.

The provisional bonding of wafers during production imposes several constraints concerning the manipulation of the wafers, namely there must be no physical or chemical deterioration of the active portion of the wafers, i.e. the areas in which the devices are constructed and the wafers must be handled solely by the periphery.

More specifically, the active wafer can be covered by active films such as of photosensitive resin. In addition, separating elements must be produced in a material not giving rise to physical or chemical pollution at the wafers, which would lead to the devices produced on the latter becoming unusable. In particular in the case of wafers for the manufacture of electronic components, it is necessary to ensure that the separating elements do not introduce alkaline compounds such as sodium or potassium, or heavy metals such as gold.

In addition, the hardness of the materials of the separating elements must be less than the layers or films used, so as not to give rise to scratches in the contact area with the wafers.

Finally the material of the separating elements must be sufficiently self-consistent to ensure that there is no delamination or exfoliation and particles are not produced which would be fixed to the wafers.

Thus, the problem is to find a technical solution for the separation of wafers, which can be automated, is fast and does not lead to any deterioration of the wafers and layers deposited on the active wafer. The use of a plate or foil, as described hereinbefore, imposes a very precise observation of the space left between the wafers at the periphery thereof (at least one wafer having to have a profiled edge). Following the separation of the wafers, it is necessary to control the movement of each of the two wafers.

Therefore the object of the invention is to provide a solution to the problem of the separation of wafers within the framework of the constraints referred to hereinbefore, whilst making the positioning problem less critical.

DESCRIPTION OF THE INVENTION

The present invention relates to a device for the separation of wafers bonded to one another by means of forces of attraction, characterized in that it comprises at least one assembly of at least two flexible elements, whose width in a direction perpendicular to the planes of the wafers is smaller than the largest gap between the ends of the wafers, at least one of the wafers having a bevelled end.

In a first variant, the flexible elements are thin plates.

In a second variant, the flexible elements are cylinders.

Advantageously, said device comprises several separating structures, each having at least two flexible elements.

The device can incorporate a suction mechanism, which is e.g. a suction pipette.

Each assembly of flexible elements (or separating structure) is advantageously maintained in a fairing in order to limit the lateral deformation and ensure a good penetration between the wafers.

The end of the flexible elements differs advantageously differs as a function of the configurations of the wafers.

The invention also relates to a process for using the device, in which separation takes place at at least one point of the periphery of the wafers and in which separation is maintained by inserting at least one mechanical element between two wafers, or by blowing gas in order to prevent the two wafers from bonding again or by removing at least one of the wafers.

The invention proposes an advantageous solution to the handling of the wafers and is therefore of interest to equipment manufacturers and suppliers, who offer machines in this field. The main interested markets are in particular those of the manufacture of power components and memory components, microprocessors and high integration density components, as well as SOI-type wafer manufacturers.

BRIEF DESCRIPTION OF THE DRAWINGS

FIG. 1 shows a prior art device.

FIGS. 2 and 3 illustrate the device according to the invention.

FIGS. 4A, 4B, 5A, 5B, 6, 7A, 7B and 7C illustrate variants of the device according to the invention.

DETAILED DESCRIPTION OF EMBODIMENTS

The invention relates to a device for the separation of wafers, e.g. of silicon. Consideration will successively be given to the two functions of separation of the wafers and maintaining the separation.

For separation purposes, the invention aims at an assembly of at least two thin, flexible elements 13 and 13' (also called separators or separating structures), which are brought into contact with the bevel of the wafers 11 and 12, as illustrated in FIGS. 2 and 3, at least one of said wafers having a bevelled end. These drawings show six flexible elements.

In FIG. 2 the elements 13 and 13' are moved up to the bonded wafers 11, 12. The elements 13 come naturally into a good position, the elements 13, 13' then having no action.

In FIG. 3, when the elements 13, 13' are close to the wafers, the elements 13, two in the present case, move apart the wafers 11 and 12. These elements 13 and 13' must have a thickness smaller than the gap left by the bevel or bevels of the edges in the direction perpendicular to the surfaces of the wafers. For example, for two 240 μm thick wafers 11 and 12 with a symmetrical bevel, said dimension will be less than 230 μm. These elements 13 and 13' can have varying dimensions in the direction parallel to the surface.

The separation of the wafers 11, 12 must be ensured at at least one point or zone of the periphery of the wafers, but several points distributed over the periphery can be used in the manner illustrated in FIGS. 5A and 5B.

In FIG. 4A the separators are thin plates.

In FIG. 4B the separators are cylinders.

In FIG. 5A several separating structures 14, 15 are used at the same time.

In FIG. 5B a suction device 16, e.g. a suction pipette, makes it possible to move away the support wafer and thus prevents rebonding. Rebonding can also be avoided by blowing gas between the wafers or by inserting a mechanical element 19.

In the invention, the use of an assembly of elements 13, 13' ensures that at least one element is naturally in a good position for ensuring the spacing of the wafers.

The mechanical excursion of the flexible elements towards the center of the wafers is limited to a zone outside active zones of the wafers. This helps prevent damage to the active zones of the wafer.

The separation operation can obviously be applied to several wafers simultaneously. Thus, in an embodiment, it is possible to separate a plurality of wafers placed in a cassette. The support wafer is e.g. removed by a suction pipette, whereas the remaining separated wafers remain in the cassette for subsequent treatment.

As illustrated in FIGS. 5A and 5B any assembly of separating elements can be maintained in a fairing or box 17, 18 in order to limit the lateral deformation and ensure a good penetration between the two wafers.

The profile of the separating elements can be variable, e.g. of increasing width from the outside towards the bottom, as illustrated in FIG. 6, in order to accentuate the separation of the two wafers 11 and 12. The end of the separating elements can be adapted as a function of the configurations, as illustrated in FIGS. 7A, 7B and 7C, which show three possible, but non-limitative, profiles of the end of a separating element. Thus, the profile of then separating element can be optimized as a function of the shape of the wafers to be separated (e.g., tapered, round or parallelepipedic profile).

In order to maintain the separation, the device according to the invention can, for example, be completed by the insertion of a mechanical element, which is preferably more rigid than a flexible element, between the two wafers to prevent the two wafers from rebonding. Additonally, the separation can be maintained by the blowing of gas, which prevents the two wafers from rebonding.

The performance of these two functions of separating the wafers and maintaining separation also makes it possible to rapidly and automatically separate pairs of wafers.

In an embodiment, use is made of a "toothbrush" type structure formed from bundles of Nylon bristles. Each bristle has a diameter of approximately 100 μm and a length of approximately 9 mm. Each bundle is constituted by about fifty bristles with a diameter of 1.5 mm. The bundles are organized in four rows of seven. Each bundle is 2.5 mm from the neighbouring bundle. The end of the bristles corresponds to the shape illustrated in FIG. 7B. The lateral path is limited to 8 mm by a PVC box, which frees the end of the bristles over 3 mm.

The separating elements are made from a material not giving rise to physical or chemical pollution at the wafers, which would render the devices produced thereon unusable. More particularly, in the case of wafers for the manufacture of electronic components, it is necessary to avoid the introduction of alkaline compounds such as sodium or potassium, or heavy metals such as gold. The hardness of the materials is preferably less than that of the layers in order not to produce scratches in the contact area with the wafers. The material is also preferably sufficiently self-consistent to ensure that it does not exfoliate or delaminate and produce particles which could be fixed on the wafers.

What is claimed is:

1. An assembly having a device for separating wafers, comprising:
    at least a first wafer and a second wafer, said first wafer and said second wafer each having an end, said first wafer being bonded to said second wafer, at least one of said ends of said wafers being a beveled end, said ends of said wafers being spaced from each other by a gap; and
    a device having at least a first flexible element and a second flexible element, each of said flexible elements having a thickness in a direction perpendicular to a plane of one of said wafers, said thickness being less than said gap.

2. The assembly of claim 1, wherein each of said flexible elements has a thickness of approximately 100 μm.

3. The assembly of claim 1, wherein said gap is less than or equal to approximately 240 μm.

4. The assembly of claim 3, wherein said gap is approximately 240 μm, and each of said flexible elements has a thickness less than approximately 230 μm.

5. The assembly of claim 1, wherein each of said ends is a beveled end.

6. The assembly of claim 1, wherein said flexible elements include thin plates.

7. The assembly of claim 1, wherein said flexible elements include cylinders.

8. The assembly of claim 1, further comprising additional flexible elements.

9. The assembly of claim 1, further comprising a suction device for applying suction to at least one of said wafers.

10. The assembly of claim 1, wherein said flexible elements are at least partially located in a fairing, said fairing for preventing lateral deformation of at least a portion of said flexible elements.

11. The assembly of claim 1, wherein at least one of said first and second flexible elements includes a parallelepipedic profile.

12. The assembly of claim 1, wherein at least one of said first and second flexible elements includes a rounded profile.

13. The assembly of claim 1, wherein at least one of said first and second flexible elements includes a tapered profile.

14. A device for separating wafers bonded together by forces of attraction, comprising:
at least one assembly of at least two flexible elements, each of said flexible elements having a thickness in a direction perpendicular to planes of the bonded wafers, said thickness being less than approximately 230 μm.

15. The device of claim 14, wherein each of said flexible elements has a thickness of approximately 100 μm.

16. The device of claim 14, wherein a sum of said thicknesses of said flexible elements is less than approximately 230 μm.

17. The device of claim 14, wherein said flexible elements include thin plates.

18. The device of claim 14, wherein said flexible elements include cylinders.

19. The device of claim 14, further comprising additional flexible elements.

20. The device of claim 14, further comprising a suction device for applying suction to at least one of said wafers.

21. The device of claim 14, wherein said flexible elements are at least partially located in a fairing, said fairing for preventing lateral deformation of at least a portion of said flexible elements.

22. The device of claim 14, wherein at least one of said flexible elements includes a parallelepipedic profile.

23. The device of claim 14, wherein at least one of said flexible elements includes a rounded profile.

24. The device of claim 14, wherein at least one of said flexible elements includes a tapered profile.

25. A method of separating bonded wafers, comprising:
at least partially separating at least two bonded wafers by inserting between the ends of the at least two bonded wafers at least one flexible element of a device having a plurality of flexible elements.

26. The method of claim 25, further comprising:
maintaining the separation by inserting at least one mechanical element between the at least two wafers.

27. The method of claim 25, further comprising:
maintaining the separation by blowing a gas between the at least two wafers.

28. The method of claim 25, further comprising:
preventing the at least two wafers from rebounding by blowing a gas between the at least two wafers.

29. The method of claim 25, further comprising:
maintaining the separation by moving at least one of the wafers away from another of the wafers.

30. The method of claim 25, wherein the separating of the at least two bonded wafers occurs at a first location at the ends of the wafers, further comprising:
at least partially separating the at least two bonded wafers at a second location at the ends of the wafers by inserting another at least one flexible element between the ends of the at least two bonded wafers at the second location.

31. The method of claim 25, wherein at least one of the ends of the wafers is a beveled end, the ends of the wafers being spaced from each other by a gap, each of the flexible elements having a thickness in a direction perpendicular to planes of the wafers, the thickness being less than the gap.

32. The method of claim 31, wherein each of the flexible elements has a thickness of approximately 100 μm.

33. The method of claim 31, wherein the gap is less than or equal to approximately 240 μm.

34. The method of claim 31, wherein the gap is approximately 240 μm, and each of the flexible elements has a thickness less than approximately 230 μm.

35. The method of claim 25, wherein the flexible elements include thin plates.

36. The method of claim 25, wherein the flexible elements include cylinders.

37. The method of claims 25, wherein the flexible elements are at least partially located in a fairing, the fairing for preventing lateral deformation of at least a portion of the flexible elements.

38. The method of claim 25, wherein at least one of the flexible elements includes a parallelepipedic profile.

39. The method of claim 25, wherein at least one of the flexible elements includes a rounded profile.

40. The method of claim 25, wherein at least one of the flexible elements includes a tapered profile.

41. The method of claim 25, wherein at least two of the flexible elements of the device are inserted between the ends of the at least two bonded wafers.

* * * * *